(12) United States Patent  (10) Patent No.: US 7,778,805 B2
Huang et al.  (45) Date of Patent: Aug. 17, 2010

(54) REGRESSION SYSTEM AND METHODS FOR OPTICAL PROXIMITY CORRECTION MODELING

(75) Inventors: Wen Chun Huang, Tainan Country (TW); Ru-Gun Liu, Hsinchu (TW); Chih-Ming Lai, Hsinchu (TW); Chen Kun Tsai, Hsinchu (TW); Chien Wen Lai, Hsinchu (TW); Cherng-Shyan Tsay, Hsinchu (TW); Cheng Cheng Kuo, Hsinchu (TW); Yao-Ching Ku, Hsin-chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1195 days.

(21) Appl. No.: 11/191,849

(22) Filed: Jul. 28, 2005

(65) Prior Publication Data

US 2007/0038417 A1  Feb. 15, 2007

(51) Int. Cl.
*G06F 7/60* (2006.01)
*G06F 17/10* (2006.01)
(52) U.S. Cl. .................. 703/2; 716/4; 716/21
(58) Field of Classification Search ........... 703/2
See application file for complete search history.

(56) References Cited

U.S. PATENT DOCUMENTS

| 6,544,699 | B1 | 4/2003 | Kim et al. |
| 6,553,559 | B2 | 4/2003 | Liebmann et al. |
| 6,721,938 | B2 | 4/2004 | Pierrat et al. |
| 6,745,380 | B2 | 6/2004 | Bodendorf et al. |
| 6,775,818 | B2 * | 8/2004 | Taravade et al. ............. 716/21 |
| 6,785,638 | B2 * | 8/2004 | Niu et al. .................... 702/189 |
| 6,792,592 | B2 * | 9/2004 | Keogan et al. ............... 716/19 |
| 6,810,291 | B2 * | 10/2004 | Card et al. ................... 700/48 |
| 7,266,800 | B2 * | 9/2007 | Sezginer ..................... 716/21 |
| 7,293,873 | B2 * | 11/2007 | Dai et al. .................... 351/205 |
| 7,325,206 | B2 * | 1/2008 | White et al. .................. 716/4 |

OTHER PUBLICATIONS

Huang et al, "OPC Modeling by Genetic Algorithm", Proceedings of SPIE-vol. 5754, Optical Microlithography XVIII, May 2004, pp. 1229-1240.*
Reich et al, "Overview of Reticle Enhancement Technology Software Strategy", Proceedings SPIE vol. 4426, pp. 77-82, Microlithographic Techniques in Integrated Circuit Fabrication, Oct. 2000.*
Zhang, Haolin "Causal Analysis of Systematic Spatial Variation in Optical Lithography", Electronics Research Laboratory, University of California, Berkley, Jun. 10, 2002.*
Doong et al, "Infrastructure Development and Integration of Electrical-based Dimensional Process Window Checking", IEEE Transactions on Semiconductor Manufacturing, vol. 17, No. 2, May 2004.*

(Continued)

*Primary Examiner*—Paul L Rodriguez
*Assistant Examiner*—Mary C Jacob
(74) *Attorney, Agent, or Firm*—Haynes and Boone, LLP

(57) ABSTRACT

An optimized optical proximity correction modeling method comprises receiving a selection of a regression method, displaying regression parameters, receiving values for the displayed regression parameters, receiving a selection of an optimization method, displaying optimization parameters, receiving values for the displayed optimization parameters, and generating an optimized optical proximity correction output.

27 Claims, 9 Drawing Sheets

OTHER PUBLICATIONS

Petersen et al, "Programmable Lithography Engine, ProLETM, Grid-Type Supercomputer and Its Applications" Proceedings of SPIE, vol. 5040, Jun. 2003, pp. 1477-1491.*

Lester Ingber et al., "Genetic Algorithms and Very Fast Simulated Reannealing: A Comparison", 1992, Mathmatical and Computer Modelling, 16(11) pp. 87-100.

"Proteus, Progen, Prospector Full-Chip Optical Proximity Correction", 7 pages. www.synopsys.com/products/avmrg/proteus_ds.html.

Yuri Granik et al., "Universal Process Modeling with VTRE for OPC", Sep. 2002, Mentor Graphics, 17 pages.

Yuri Granik et al., "New Process Models for OPC at sub-90nm Nodes", Mentor Graphics, 9 pgs.

* cited by examiner

Smart Model Regression - V.12----File: ban / wchuang / api / CLN65_120a_ani

| File | Method | Mode | Calculate | plot | Result | option | Verification | Exit | Help |

| Numer. Param. | Ini. Values | | Phy. Param. | | Ini. Values | Best Values | Cost Function |
|---|---|---|---|---|---|---|---|
| ALPHA | 1 | | ☐ lambda= | | 0.193 | 0.193 | 50.7947 |
| Beta | 0.5 | | ☐ na= | | 0.7685 | 0.7685 | |
| GAMMA | 2 | | ☐ sigma= | | 0.7796 | 0.7796 | |
| RTOL | 1e-05 | | ☐ sigmain= | | 0.4301 | 0.4301 | |
| SCALE | 0.05 | | ■ defoc= | | 0.1329 | 0.1329 | |
| ITMAX | 200 | | ☐ load_wt= | | 0.0615 | 0.0615 | |
| | | | ☐ load_stddev= | | -0.057 | -0.057 | |
| | | | ☐ res_stddev= | | -0.023 | -0.023 | |
| | | | ☐ Max_Spatial_F | | 44.172 | 44.172 | |
| | | | ☐ threshold= | | 0.24 | 0.24 | |

Calculating completely

BESTCHISQ= 50.7947,
0.193 0.76851 0.77969 0.43019 0.13296 0.06151 -0.05798 -0.02384 44.1726 0.24,
DIS= , DRATE=10
The number of parameters for turning=1
Initial values=0.193 0.76851 0.77969 0.43019 0.12962 0.06151 -0.02384 44.1726 0.24
Select Simplex Down-Hill method
number of data=505

REGRESSION SYSTEM AND METHODS FOR OPTICAL PROXIMITY CORRECTION MODELING

BACKGROUND

Optical proximity correction or OPC is a technique that has been used in semiconductor device fabrication to produce sub-micron integrated circuit feature sizes. OPC applies systematic changes to photomask geometries to compensate for non-linear distortions caused by optical diffraction, as well as photoresist development and etch process effects.

OPC model regression may use the definitive search method and the conjugate gradient method. The definitive search method calculates all the grid points of parameter space to obtain the best parameters to minimize or maximize a merit function. The merit function depends on the deviations between model-predicted values and experimental data. The conjugated gradient method optimizes the merit function to obtain the best parameters by means of the gradients of the current parameters. However, vast computation power and resources are needed to compute the dense grid points and inaccurate results for sparse calculation grids make the definitive search method impractical. The conjugate gradient method is inefficient because of the large estimation errors of the gradients for non-linear systems and local optimization characteristics.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 3 is an exemplary screen for accepting user-input of an embodiment of the regression system for optical proximity correction modeling;

DETAILED DESCRIPTION

The model-based optical proximate correction (OPC) regression is improved by using techniques such as numerical optimization and artificial intelligence methods.

Figure 1:
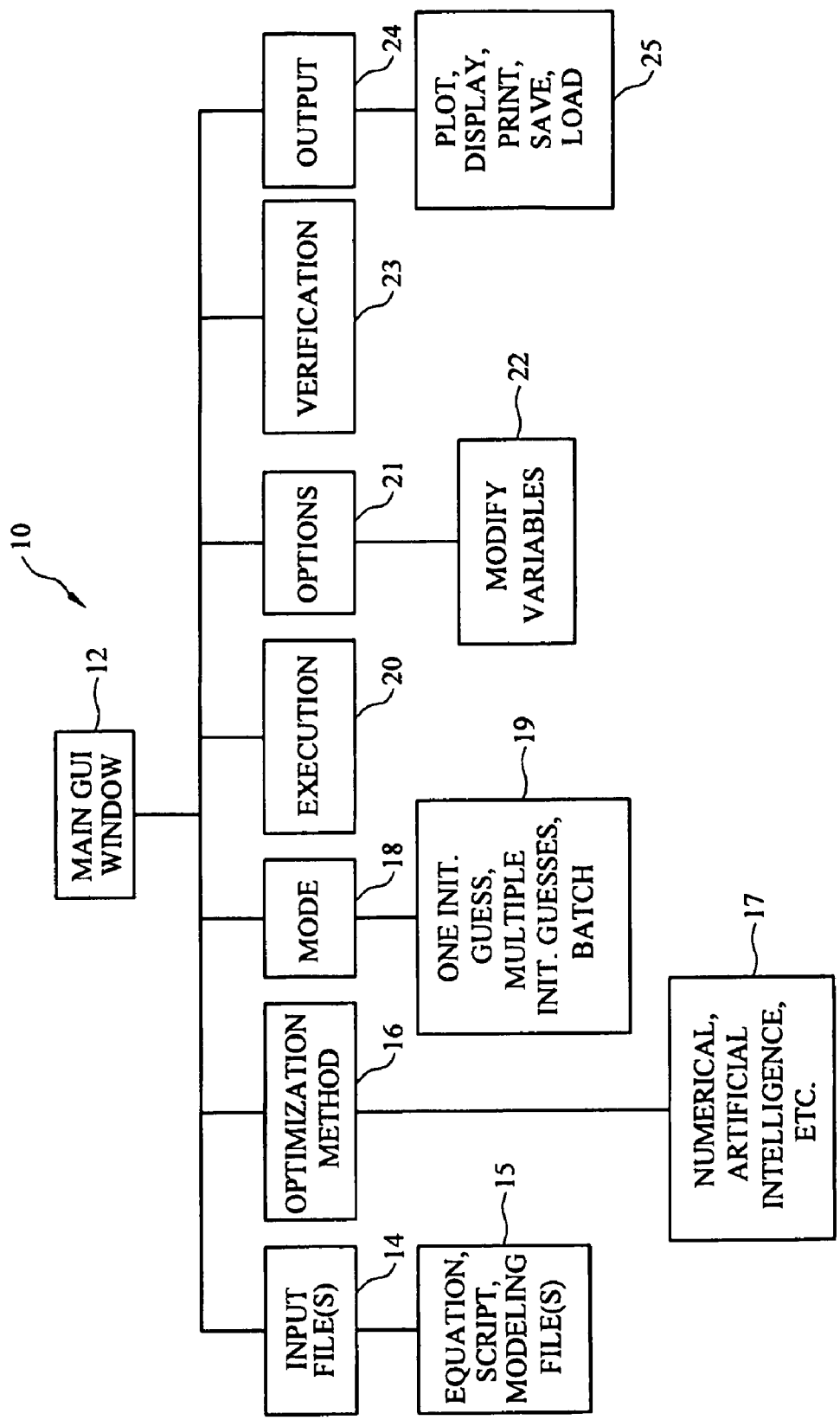
FIG. 1 is a simplified navigation architectural diagram of an embodiment of regression system for optical proximity correction modeling.

FIG. 1 is a simplified navigation architectural diagram of an embodiment of regression system 10 for optical proximity correction modeling. System 10 includes a main graphical user interface (GUI) window 12 that users may use for navigation purposes. Main GUI window 12 may include a plurality of functions to permit the user to provide input parameters and data and to make selections. The functions may be displayed as elements of a pull-down menu, tabs across the top of the window, clickable options in a menu task bar, or in another graphical manner. These functions may include a specification of input files function 14, such as permitting the user to specify the file names of equation files, script files, modeling files, etc. 15. Main GUI window 12 may also include a user-specification of one or more optimization methods 16, such as specifying numerical, artificial intelligence, etc. methods 17. Main GUI window 12 may include a mode function 18 that enables a user to specify the operational mode of the process, such as one initial guess, multiple initial guesses, batch mode, etc. 19. Main GUI window 12 may further include a calculation function 20 that the user may select to begin the regression process. Main GUI window 12 may also include an options function 21 that enables the user to modify one or more variables used in the regression process 22. Main GUI window 12 may include a verification function 23 to enable the user to verify the results of the regression process. Main GUI window 12 may further include an output function 24 that the user may use to specify how the results should be provided 25, such as plotted, printed, displayed on-screen, saved, etc. FIG. 3 provides an exemplary screen or window of a menu task bar with another set of similar navigable functions.

Figure 2:
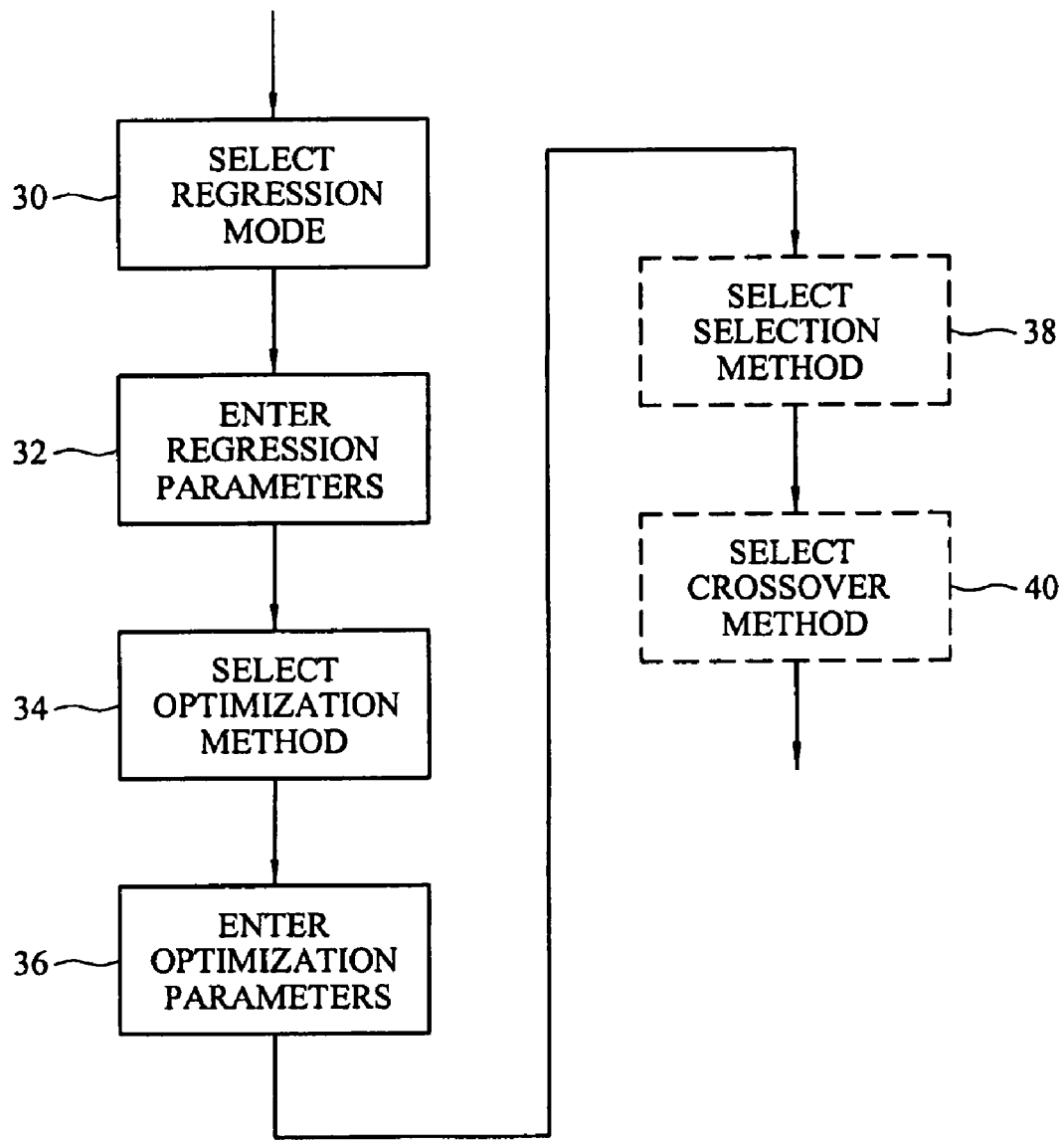
FIG. 2 is a simplified flowchart of a user-input process for an embodiment of the regression system for optical proximity correction modeling.

FIG. 2 is a simplified flowchart of a user-input process for an embodiment of the regression system for optical proximity correction modeling. In step 30, a user-selection of a regression method is received. The user may select from a drop-down menu listing of regression modes such as one initial guess, multiple initial guesses, and batch mode, for example. In step 32, a user-entry of one or more regression parameter values are received. The user may be prompted to fill in data fields or dialog boxes with parameter values or indicate a file name where the input parameters are stored. In step 34, a user-selection of an optimization method is received. The user may select from a drop-down menu list that may include, for example, Levenberg-Marquardt, downhill simplex, genetic algorithm (an evolutionary algorithm), simulated annealing, and neural network. In step 36, a user-entry of one or more optimization parameter values are received. The user may be prompted to fill in data fields or dialog boxes with optimization parameter values or indicate a file name where the parameter values are stored. In steps 38 and 40, further method selections are received from the user if genetic algorithm is the chosen optimization method. The user may be prompted to select from roulette wheel, tournament, and random selection methods, and uniform, single-point, and two-point crossover methods.

FIG. 3 is an exemplary screen 44 for accepting user-input of an embodiment of the regression system for optical proximity correction modeling. For this example, the diffused aerial image model (DAIM) was calibrated. The model is composed of pure optical kernels, Gaussian kernel for loading effect, and Gaussian kernel for acid diffusion. The optical kernels are linear combination of sampling functions and are function of numerical aperture, partially coherent factors, depth of focus, and light wavelength. The number of sampling function for different order, retained kernel number, may comprise regression parameters. The number of sampling function and the number of retained kernel are integer parameters. FIG. 3 shows that the down-hill simplex method was chosen as the optimization method and a number of numerical parameters: alpha, beta, gamma, rtol, scale, and itmax have been provided with user-input. Scale is a parameter relative to initial guesses. Alpha, beta, and gamma control the search path of parameters. Rtol and itmax are parameter relative to convergence. The screen also shows a number of physical parameters that are regression parameter initial values used by the regression methods and best values generated by the regression method. Lambda is wavelength, na is numerical aperture, sigma and sigmin are partially coherent factors, load_stddev is the standard deviation of Gaussian kernel for loading, res_stddev is the standard deviation of Gaussian kernel for acid diffusion, load wt is the coefficient of loading kernel, Max Spatial Freq is the sampling rate of sampling function, and threshold is the intensity value to determine the line-width. The integer parameters need not be calibrated in this case.

Figure 4:
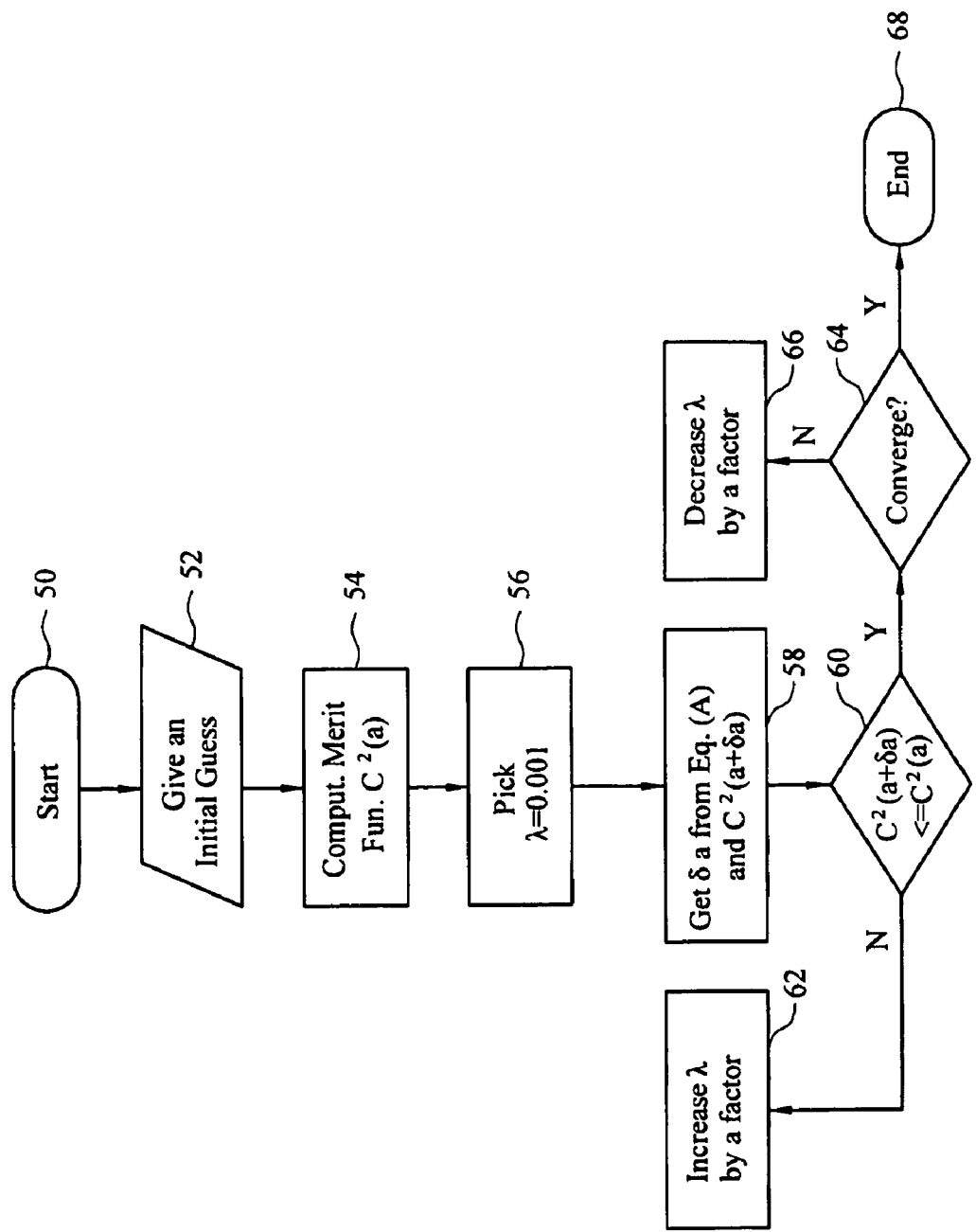
FIG. 4 is a simplified flowchart for an embodiment of a Levenberg-Marquardt process of regression system and method for optical proximity correction modeling.

FIG. 4 is a simplified flowchart for an embodiment of a Levenberg-Marquardt process 50 of regression system and method for optical proximity correction modeling. Levenberg-Marquardt is an advanced non-linear optimization algorithm. Its goal is to minimize the sum-of-squares error function. A figure-of-merit function (or merit function) that measures the agreement between the data and the model with a particular choice of parameters is used. The merit function is conventionally arranged so that small values represent close agreement. The parameters of the model are then adjusted to achieve a minimum in the merit function, yielding best-fit parameters. The merit function is WSSR—weighted sum of squared residuals—shown below:

$$x^2(a) = \sum_{i=1}^{N} \left[\frac{y_i - y(x_i; a)}{\sigma_i}\right]^2 = \sum_{i=1}^{N} w_i [y_i - y(x_i; a)]^2$$

where $w_i$ is weighting factor for each data point, $y_i$ is dimension on wafer (DOW), a is a vector parameter for regression, N is number of points, and $y(x_i, a)$ is predicted values of the model.

$$\sum_{l=1}^{M} \alpha'_{kl} \delta a_l = \beta_k \quad \ldots \quad (A)$$

$$\alpha'_{jj} \equiv \alpha_{jj}(1 + \lambda)$$

$$\alpha'_{jk} \equiv \alpha_{jk} (j \neq k)$$

$$\alpha_{kl} = \sum_{i=1}^{N} W_i \left[\frac{\partial y(x_i, a)}{a_k} \frac{\partial y(x_i; a)}{\partial a_l}\right]$$

After some $$\beta_k = \sum_{i=1}^{N} W_i [y_i - y(x_i, a)] \frac{\partial y(x_i; a)}{\partial a_k}$$

derivation, the following is obtained: and k=1, ..., M; l=1, ..., M; and M is the number of parameters.

Referring to FIG. 4, in step 52, an initial guess is provided. In step 54, the merit function $C^2(a)$ is computed. In step 56, the value of λ is set to a starting value, such as 0.001, for example. In step 58, δa and $C^2(a+\delta a)$ are computed. In step 60, a determination of whether $C^2(a+\delta a)$ is less than or equal to $C^2(a)$ is determined. If $C^2(a+\delta a)$ is not less than or equal to $C^2(a)$, then the value of λ is increased by a predetermined factor in step 62. If $C^2(a+\delta a)$ is less than or equal to $C^2(a)$, a determination of whether the solution converge on a minimum is made in step 64. If the solution has not converged to a minimum, then the value of λ is decreased by a predetermined factor in step 66. On the other hand, if the solution has converged to a minimum, then the process ends in step 68.

Figure 5:
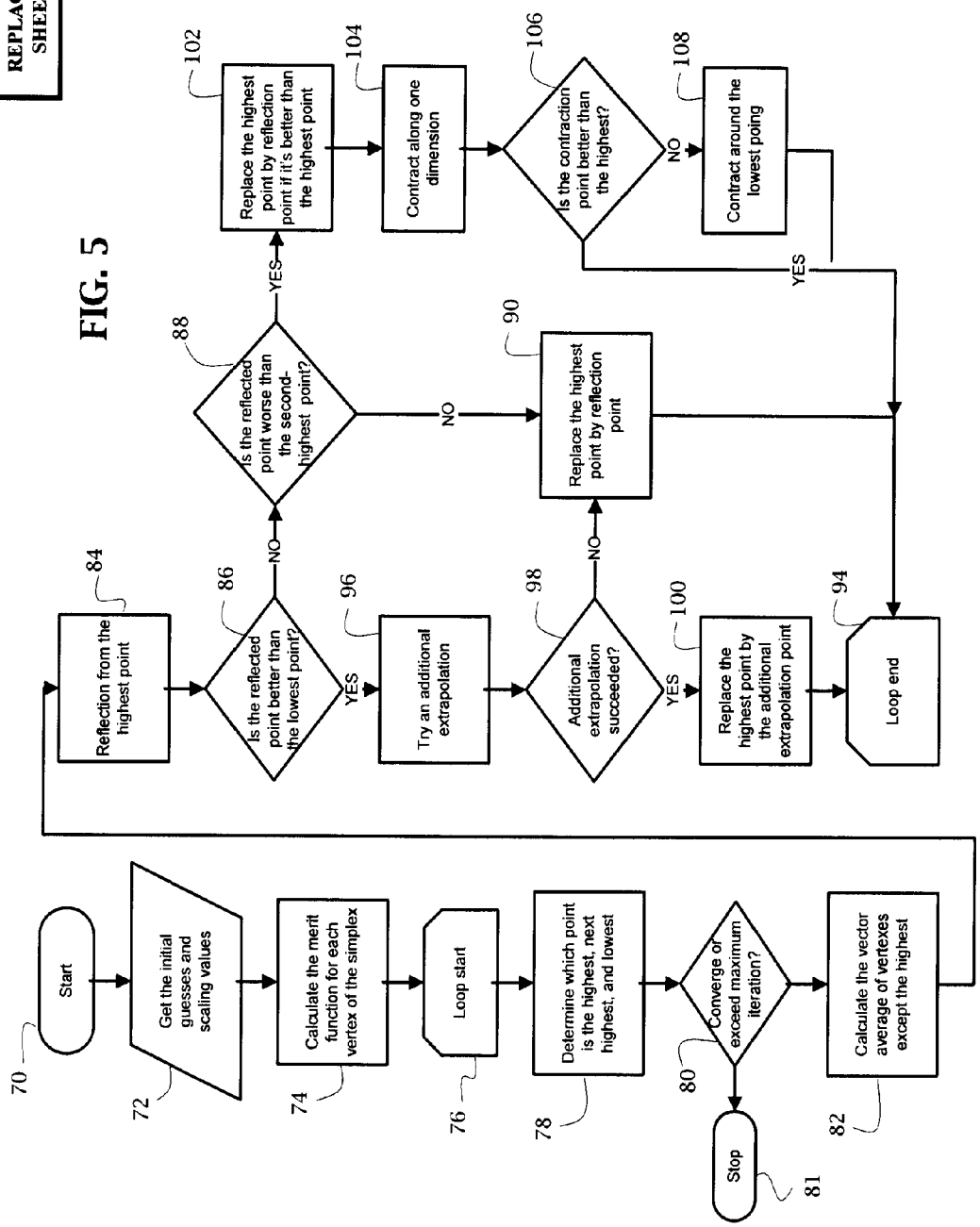
FIG. 5 is a simplified flowchart for an embodiment of a down-hill simplex process of regression system and method for optical proximity correction modeling.

FIG. 5 is a simplified flowchart for an embodiment of a down-hill simplex process 70 of regression system and method for optical proximity correction modeling. A simplex is a geometrical entity that has n+1 vertices corresponding to variations in n parameters. The value of the objective function is calculated at each of the vertices. At each iteration, the vertex with the highest value of the objective merit function is located and replaced by a vertex that lies on the line between it and the centroid of the other vertices. Four possible replacements can be considered: a reflection away from the highest point, a reflection away and expansion from the highest point, a contraction along one dimension from the highest point, and a contraction along all dimension toward the lowest point.

In step 72, the initial guesses and scaling values are received or computed. In step 74, the merit function for each vertex of the simplex is computed. In step 76, a loop or iterative process starts. In step 78, a determination of the highest, next highest, and lowest vertices is made. In step 80, a determination is made as to whether the solution has converged to a minimum or a predetermined maximum loop counter or number of iterations has been exceeded. If these criteria is met, then the process stops in step 81. Otherwise in step 82, the vector average of all the vertices except the highest vertex is computed. In step 84, the reflection from the highest vertex is found. In step 86, a determination is made as to whether the reflected point is better than the lowest vertex, i.e. yields the minimum function. If the reflected point is not better than the lowest point, then a determination is made as to whether the reflected point is worse than the second highest vertex in step 88. If the reflected point is not worse than the second highest vertex, then the highest vertex is replaced by the reflection point in step 90 and the loop ends in step 94 and execution proceeds to step 76 for the next iteration.

If in step 86, the reflected point is better than the lowest vertex, then in step 96 an additional extrapolation is made to arrive at a reflection away and expansion from the highest vertex. In step 98, a determination as to whether the additional extrapolation succeeded is made. If not, then the highest vertex is replaced by the reflection point in step 90. If the additional extrapolation succeeded, then the highest vertex is replaced by the additional extrapolation point in step 100 and the loop iteration ends in step 94 and execution proceeds to step 76 for the next iteration.

If the reflected point is worse than the second highest vertex, as determined in step 88, then in step 102 the highest point is replaced by the reflection point if it is better than the highest vertex. In step 104, a contraction is made along one dimension. In step 106, a determination is made as to whether the contraction point is better than the highest vertex. If the contraction is not better than the highest vertex, then in step 108 a contraction along all dimensions toward the lowest vertex is made and the loop iteration ends in step 94 and execution proceeds to step 76 for the next iteration. If the contraction is better than the highest vertex, as determined in step 106, then the loop iteration ends in step 94 and execution proceeds to step 76 for the next iteration. In this manner, the computation makes iterations until the solution converges or the predetermined number of maximum iteration has been reached.

Figure 6:
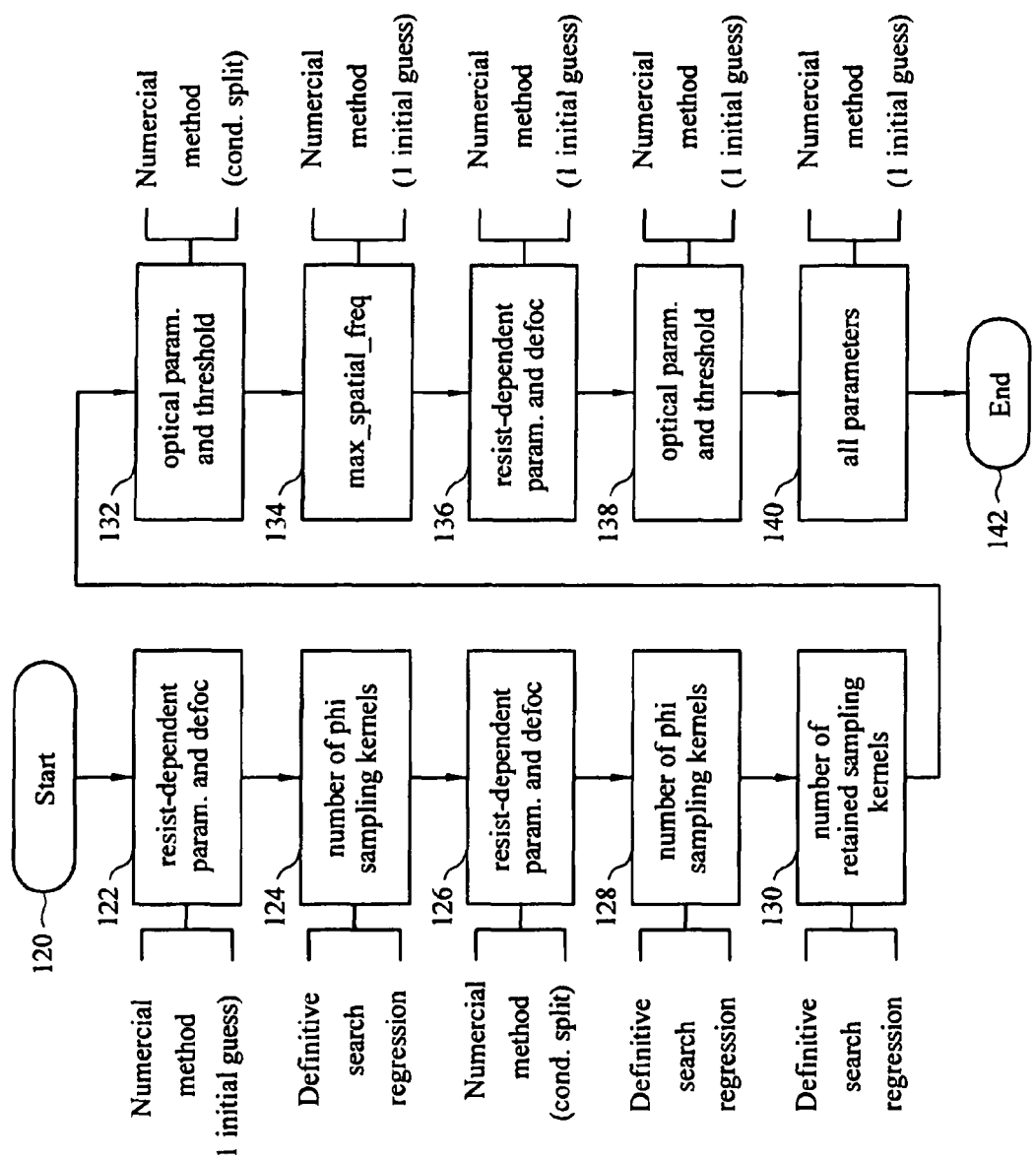
FIG. 6 is a simplified flowchart for an embodiment of a fitting process of regression system and method for optical proximity correction modeling.

FIG. 6 is a simplified flowchart for an embodiment of a batch fitting process 120 of regression system and method for optical proximity correction modeling. This batch combine numerical method (e.g. downhill simplex) and definitive search to optimize a system with both real and integer parameters. In step 122, a numerical method is used to regress depth of focus and non-optical parameters such as standard deviations of Gaussian kernels. In step 124, the integer parameters such as the numbers of sampling function are optimized by definitive search. In steps 126 and 128, repeat steps 122 and 124, respectively. In step 130, numbers of retained kernel are optimized. In step 132, threshold and optical parameters such as numerical aperture and partially coherent factors are regressed. In step 134, the sampling rate, max spatial freq, is regressed. In steps 136 and 138, repeat steps 122 and 132, respectively. In step 140, all real parameters are regressed by numerical method. In step 142, complete the whole batch.

Figure 7:
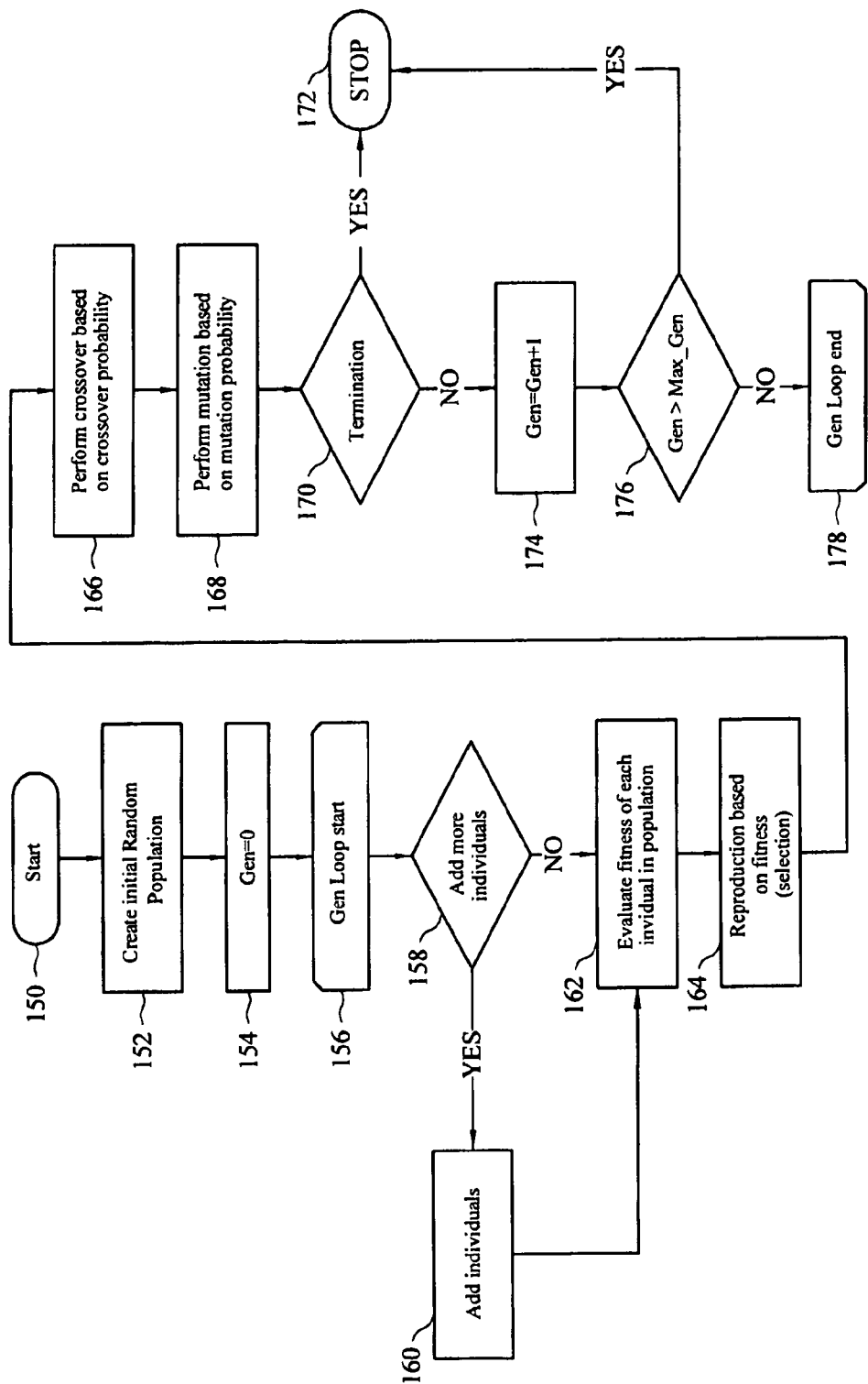
FIG. 7 is a simplified flowchart for an embodiment of a genetic algorithm of regression system and method for optical proximity correction modeling.

FIG. 7 is a simplified flowchart for an embodiment of an evolutionary algorithm such as the genetic algorithm (GA) for regression system and method 150 for optical proximity correction modeling. Genetic algorithms are artificial intelligence stochastic search algorithms that exploit genetic evolution and natural selection. The mechanics of a genetic algorithm are: (1) maintain a population of solutions coded as artificial chromosomes, (2) select the better solutions for recombination (crossover) of the mating chromosomes, (3) perform mutation and other variation operators on the chromosomes, and (4) use these offspring to replace poorer solutions or to create a new generation. Genetic algorithms may be used to optimize both integer and real variables simultaneously for OPC model fitting.

Figure 8:
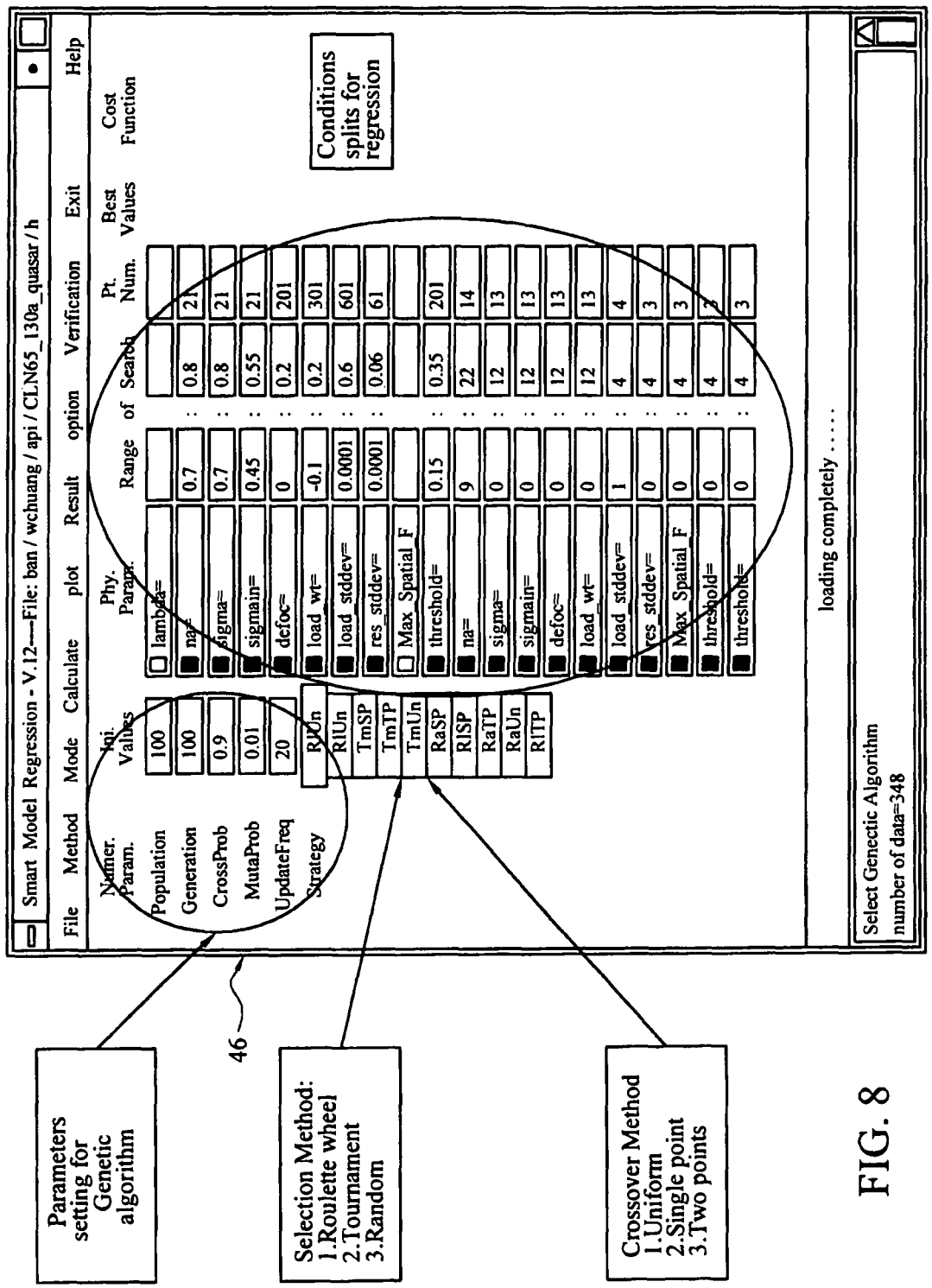
FIG. 8 is an exemplary screen for multiple guesses genetic algorithm regressing for optical proximity correction.

In step 152, an initial random population is created. In step 154, a generation counter, Gen, is initialized to zero. In step 156, the generation loop begins. In step 158, a determination whether more individuals should be added to the initial population is made. If more individuals should be added, then in step 160 the population is increased with more individuals. Otherwise in step 162, the fitness of each individual in the population is evaluated. In step 164, a predetermined number of the fittest individuals in the population undergoes a selective reproduction process. In step 166, crossover or genetic recombination is performed based on crossover probability. In step 168, mutation in the crossover is simulated based on mutation probability. In step 170, whether the process should be terminated is determined. The process may be terminated in step 172 based on whether optimization has been reached. If in step 170 the process is not to be terminated then the generation counter, Gen, is incremented in step 174, and its count value is compared with a predetermined maximum generation number, Max_Gen, in step 176. If the maximum has been reached, then the process terminates in step 172. In step 178, the end of the loop is reached and the iteration is repeated again by proceeding to step 156. Genetic algorithm regression may provide a single initial guess at the optimized solution or multiple guesses at the optimized solution. An exemplary screen for multiple guesses genetic algorithm regression for optical proximity correction is shown in FIG. 8. The numerical parameters are parameters specific to genetic algorithm, physical parameters are regression parameters, and the strategy parameter under numerical parameters gives the user the ability to choose a selection method and a crossover method. As shown in FIG. 8, the integer parameter such as phi and retain and real parameters such as na and sigma may be regressed simultaneously.

Figure 9:
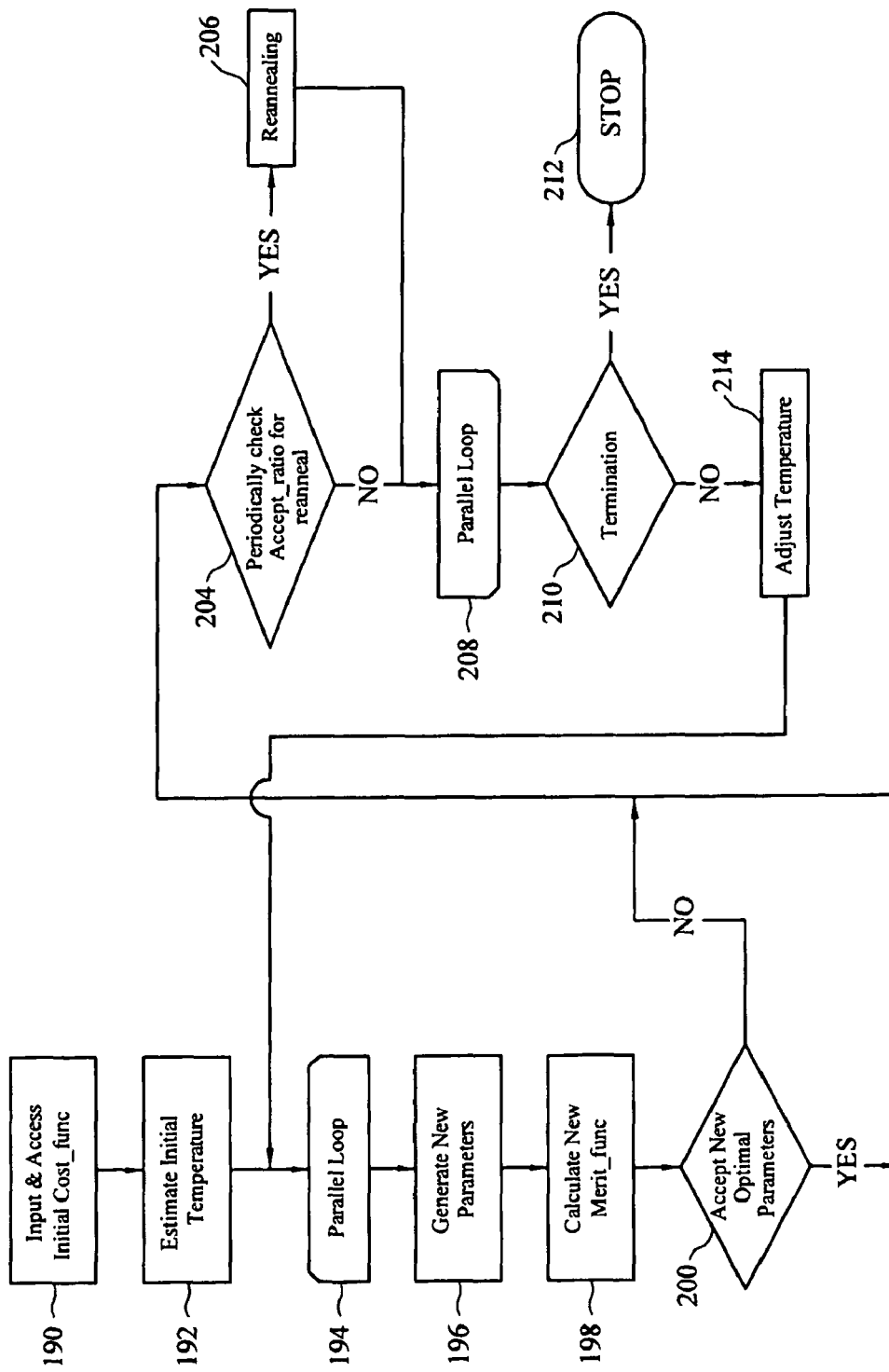
FIG. 9 is a simplified flowchart for an embodiment of a simulated annealing of regression system and method for optical proximity correction modeling.

FIG. 9 is a simplified flowchart for an embodiment of a simulated annealing of regression system and method for optical proximity correction modeling. Simulated annealing is a stochastic search technique that exploits an analogy between the way in which a metal cools and freezes into a minimum energy crystalline structure, which is commonly called annealing. This technique approaches the global maximization problem similarly to using a bouncing ball that can bounce over mountains from valley to valley. At the beginning, the ball is at high energy or high temperature and can bounce up to great heights, but as the temperature declines the ball reaches lower and lower heights and may become trapped in a valley. A general distribution dependent on the temperature of the ball generates possible valleys or states to be searched and explores. An acceptance distribution also dependent on the temperature is defined to decide probabilistically whether the ball should stay in the lower valley or to bounce out of it.

In step 190 shown in FIG. 9, the initial merit function is provided as an input. In step 192, an estimate of an initial temperature is performed. In step 194, the beginning of a loop starts. This loop iteratively generates new parameters in step 196. In step 198, the new merit function is calculated, and a determination is made whether to accept new optimal parameters in step 200. If the determination is yes, the stories are updated in step 202, and then execution proceeds to step 204. The stories record the accepted parameter sets and their merit functions. However, if the determination in step 200 is no, then execution proceeds directly to step 204. In step 204, a determination is made as to whether periodic re-anneal should be performed to rescale the annealing time and acceptance temperature. Re-annealing is done to deal with different changing sensitivities of annealing parameters. If re-annealing should be performed, then parameters are adjusted in step 206. If re-annealing is not to be performed, then in step 208 the loop ends. In step 210, a determination is made as to whether the search should be terminated. If not, the temperature is adjusted or lowered in step 214, and then the execution proceeds to step 194 to the beginning of the loop. Otherwise, the process ends in step 212. Simulated anneal may be used to optimize both integer and real variables simultaneously for OPC model fitting.

Two approaches have been described herein for optical proximity correction modeling for the regression of integer and real parameters simultaneously. One approach uses an artificial intelligence method such as genetic algorithm, simulated annealing, and neural network. Another approach combines numerical optimization methods such as downhill simplex and Levenberg-Marquardt with definitive search method. Empirical results have shown that OPC modeling cycle time would be reduced by at least 40 times using numerical and/or artificial intelligence optimization methods as described above compared to definitive search method. OPC modeling accuracy is also greatly improved. Although specific methods for numerical and artificial intelligence optimization are described herein, other variations of these optimization methods as well as other numerical and artificial intelligence optimization methods are contemplated herein. For example, a neural network optimization method may be used herein.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims.

What is claimed is:

1. An optimized optical proximity correction modeling method, comprising:
   receiving a selection of a regression method;
   displaying regression parameters based on the selected regression method;
   receiving values for the displayed regression parameters;
   receiving a selection of an optimization method;
   displaying optimization parameters based on the selected optimization method;
   receiving values for the displayed optimization parameters; and
   generating an optimized optical proximity correction output based on the received values for the displayed regression parameters and the received values for the displayed optimization parameters.

2. The method of claim 1, wherein the optimization method is selected from the group consisting of Levenberg-Marquardt, downhill simplex, evolutionary algorithm, genetic algorithm, simulated annealing, and neural network.

3. The method of claim 1, wherein receiving a selection of an optimization method comprises selecting a genetic algorithm method, wherein the genetic algorithm method comprises regressing real and integer parameters substantially simultaneously.

4. The method of claim 1, wherein receiving a selection of an optimization method comprises selecting a genetic algorithm method, wherein the genetic algorithm method comprises receiving a selection of a selection method and a selection of a crossover method.

5. The method of claim 1, wherein receiving a selection of an optimization method comprises selecting a downhill simplex method, wherein the downhill simplex method comprises regressing real parameters.

6. The method of claim 1, wherein receiving a selection of an optimization method comprises selecting a downhill simplex method, wherein the downhill simplex method comprises combining the downhill simplex method with a definitive search method in batch mode to regress real and integer parameters.

7. The method of claim 1, wherein receiving values for the displayed regression parameters and/or receiving values for the displayed optimization parameters further comprises receiving a specification of a file having input data.

8. The method of claim 1, wherein generating an optimized optical proximity correction output further comprises receiving a selection of an operating mode selected from the group consisting of one initial guess, multiple initial guesses, and batch modes.

9. The method of claim 1, wherein generating an optimized optical proximity correction output further comprises receiving a selection of an output mode.

10. The method of claim 1, wherein generating an optimized optical proximity correction output further comprises computing a cost function.

11. The method of claim 1, wherein generating an optimized optical proximity correction output further comprises searching for an optimized optical proximity correction solution in a predefined space containing many solutions.

12. An optimized optical proximity correction modeling system, comprising:
   a graphical user interface; and
   a processor for executing instructions in a computer-readable medium, wherein the instructions are for:
   receiving a selection of a regression method;
   displaying regression parameters based on the selected regression method;
   receiving values for the displayed regression parameters;
   receiving a selection of an optimization method;
   displaying optimization parameters based on the selected optimization method;
   receiving values for the displayed optimization parameters; and
   generating an optimized optical proximity correction output based on the received values for the displayed regression parameters and the received values for the displayed optimization parameters.

13. The system of claim 12, wherein the optimization method is selected from the group consisting of Levenberg-Marquardt, downhill simplex, evolutionary algorithm, genetic algorithm, simulated annealing, and neural network.

14. The system of claim 12, wherein receiving a selection of an optimization method comprises selecting an evolutionary algorithm method, wherein the evolutionary algorithm method comprises receiving a selection of a selection method and a selection of a crossover method.

15. The system of claim 12, wherein receiving values for the displayed regression parameters and/or receiving values for the displayed optimization parameters further comprises receiving a specification of a file having input data.

16. The system of claim 12, wherein generating an optimized optical proximity correction output further comprises receiving a selection of an operating mode selected from the group consisting of one initial guess, multiple initial guesses, and batch modes.

17. The system of claim 12, wherein generating an optimized optical proximity correction output further comprises receiving a selection of an output mode.

18. The system of claim 12, wherein generating an optimized optical proximity correction output further comprises computing a cost function.

19. The system of claim 12, wherein generating an optimized optical proximity correction output further comprises searching for an optimized optical proximity correction solution in a predefined space containing many solutions.

20. An optimized optical proximity correction modeling method, comprising:
   selecting a regression method;
   determining values for a plurality of regression parameters based on the selected regression method;
   selecting an optimization method;
   determining values for a plurality of optimization parameters based on the selected optimization method; and
   generating an optimized optical proximity correction output based on the determined values for the plurality of regression parameters and the determined values for the plurality of optimization parameters.

21. The method of claim 20, wherein the optimization method is selected from the group consisting of Levenberg-Marquardt, downhill simplex, evolutionary algorithm, genetic algorithm, simulated annealing, and neural network.

22. The method of claim 20, wherein selecting an optimization method comprises selecting a genetic algorithm, wherein the genetic algorithm comprises selecting a selection method and a crossover method.

23. The method of claim 20, wherein determining values for the plurality of regression parameters and/or determining values for the plurality of optimization parameters further comprises receiving a specification of a file having input data.

24. The method of claim 20, wherein generating an optimized optical proximity correction output further comprises selecting an operating mode selected from the group consisting of one initial guess, multiple initial guesses, and batch modes.

25. The method of claim 20, wherein generating an optimized optical proximity correction output further comprises selecting an output mode.

26. The method of claim 20, wherein generating an optimized optical proximity correction output further comprises computing a cost function.

27. The method of claim 20, wherein generating an optimized optical proximity correction output further comprises searching for an optimized optical proximity correction solution in a predefined space containing many solutions.

* * * * *